United States Patent
Sugawara

(10) Patent No.: US 6,895,028 B2
(45) Date of Patent: May 17, 2005

(54) LIGHT-EMITTING ELEMENT CONTROLLER, OPTICAL TRANSMITTING APPARATUS, AND METHOD AND COMPUTER PROGRAM FOR DETERMINING DRIVING CURRENT

(75) Inventor: Mitsuru Sugawara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 10/317,799

(22) Filed: Dec. 12, 2002

(65) Prior Publication Data

US 2003/0118063 A1 Jun. 26, 2003

(30) Foreign Application Priority Data

Dec. 20, 2001 (JP) ..................................... P2001-388006
Dec. 10, 2002 (JP) ..................................... P2002-357930

(51) Int. Cl.$^7$ .............................................. H01S 3/13
(52) U.S. Cl. ................................... 372/38.02; 372/38.1
(58) Field of Search ........................... 372/29.075, 38.1, 372/38.01–38.02

(56) References Cited

U.S. PATENT DOCUMENTS

| | | | | |
|---|---|---|---|---|
| 4,998,257 A | * | 3/1991 | On et al. .................. | 372/29.02 |
| 5,065,456 A | * | 11/1991 | Nakayama .................. | 398/197 |
| 5,548,435 A | * | 8/1996 | Tahara et al. ............... | 398/195 |
| 5,579,328 A | * | 11/1996 | Habel et al. .................. | 372/31 |
| 5,974,063 A | * | 10/1999 | Yoshida .................... | 372/38.02 |
| 6,055,252 A | * | 4/2000 | Zhang ......................... | 372/34 |
| 6,091,747 A | * | 7/2000 | Morita et al. ............ | 372/38.02 |
| 6,292,497 B1 | * | 9/2001 | Nakano ................. | 372/29.015 |
| 6,330,258 B1 | * | 12/2001 | Kawamura .................... | 372/30 |
| 6,661,817 B1 | * | 12/2003 | Ames et al. ........... | 372/29.021 |
| 6,697,400 B2 | * | 2/2004 | Nomura .................... | 372/38.02 |

FOREIGN PATENT DOCUMENTS

| | | | | |
|---|---|---|---|---|
| JP | 06152028 A | * | 5/1994 | ........... H01S/3/096 |
| JP | 07-147446 | | 6/1995 | |
| JP | 10-163555 | | 6/1998 | |

* cited by examiner

*Primary Examiner*—Don Wong
*Assistant Examiner*—Phillip Nguyen
(74) *Attorney, Agent, or Firm*—Hogan & Hartson, LLP

(57) ABSTRACT

A pulse current component of a driving current is determined, based on a current-optical output coefficient derived using average optical output information of a semiconductor light-emitting element. A bias current component can be set by adjusting an average optical output of the semiconductor light-emitting element while changing the bias current component by the driving current including the determined pulse current component. Since the current-optical output coefficient can be derived based on the average optical output under wide conditions, both the pulse current component and the bias current component can be determined under the wide conditions and without using a quick-response light detector.

10 Claims, 11 Drawing Sheets

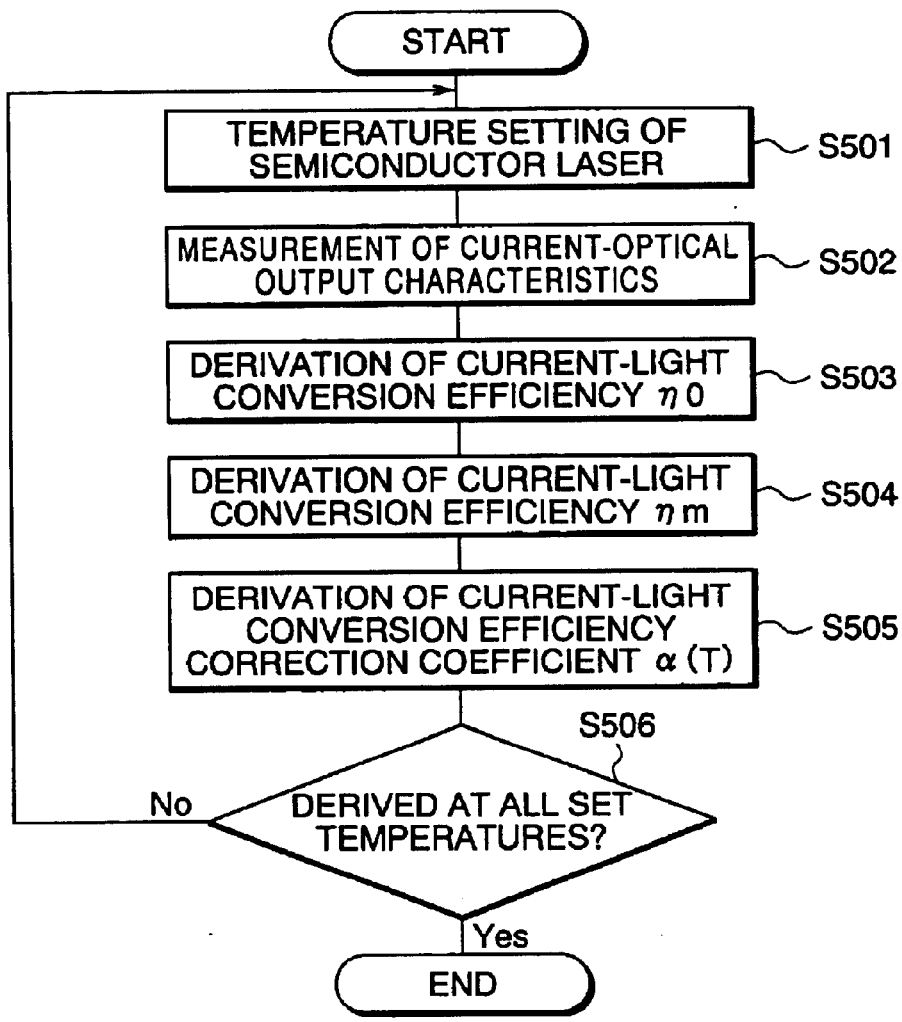

LIGHT-EMITTING ELEMENT CONTROLLER, OPTICAL TRANSMITTING APPARATUS, AND METHOD AND COMPUTER PROGRAM FOR DETERMINING DRIVING CURRENT

CROSS-REFERENCE TO RELATED APPLICATION

This application is based upon and claims the benefit of priority from the prior Japanese Patent Application No. 2001-388006, filed on Dec. 20, 2001 and the prior Japanese Patent Application No. 2002-357930 filed on Dec. 10, 2002; the entire contents of which are incorporated herein by reference.

BACKGROUND

1. Field of the Invention

The present invention relates to a light-emitting element controller, an optical transmitting apparatus, and a method and a program for determining a driving current, and more specifically, to a light-emitting element controller which controls a semiconductor light-emitting element, an optical transmitting apparatus, and a method and a program for determining a driving current.

2. Description of the Related Art

In optical communication, semiconductor lasers are typically used as light-emitting elements. The semiconductor laser has current-optical output characteristics that it emits light when its driving current exceeds a current value called an oscillation threshold current (hereafter, called "threshold current"), and the optical output is proportional to the amount of the driving current exceeding the threshold current.

The semiconductor laser is driven by a driving current made by superimposing a bias current and a pulse current one upon the other, and drive conditions thereof are appropriately set based on the current-optical output characteristics.

By the way, the current-optical output characteristics vary with its environmental temperature change and aging.

Therefore, to cope with a change in the current-optical output characteristics, it has been tried to change the drive conditions (the bias current and the pulse current) of the semiconductor laser (for example, Japanese Patent Laid-Open No. Hei 7-147446).

SUMMARY (1) A light-emitting element controller according to an aspect of the present invention is a light-emitting element controller which controls a semiconductor light-emitting element driven by a driving current including a bias current component and a pulse current component, having: a current-optical output coefficient deriving unit which derives a current-optical output coefficient representing a correspondence relation between the amount of change in current supplied to the semiconductor light-emitting element and the amount of change in optical output, based on average optical output information representing a time average of the optical output of the semiconductor light-emitting element; a pulse current determining unit which determines the pulse current component of the driving current, based on the current-optical output coefficient derived by the current-optical output coefficient deriving unit; and a bias current determining unit which determines the bias current component of the driving current, based on the average optical output information of the semiconductor light-emitting element driven by the driving current including the pulse current component determined by the pulse current determining unit.

(2) A driving current determining method according to another aspect of the present invention is a driving current determining method for determining a driving current of a semiconductor light-emitting element driven by the driving current including a bias current component and a pulse current component, having: deriving a current-optical output coefficient representing a correspondence relation between the current for driving the semiconductor light-emitting element and an optical output; determining the pulse current component, based on the drived current-optical output coefficient; controlling the driving current, based on the determined pulse current; and determining the bias current component, based on the optical output of the semiconductor light-emitting element driven by the controlled driving current.

BRIEF DESCRIPTION OF THE DRAWINGS

FIG. 10 is a flowchart showing a procedure for deriving a current-light conversion efficiency correction coefficient. (T).

FIG. 11 is a diagram showing an example of a current-light conversion efficiency correction table.

DETAILED DESCRIPTION (First Embodiment)

Hereafter, an embodiment of the present invention will be explained in detail with reference to the drawings.

Figure 1:
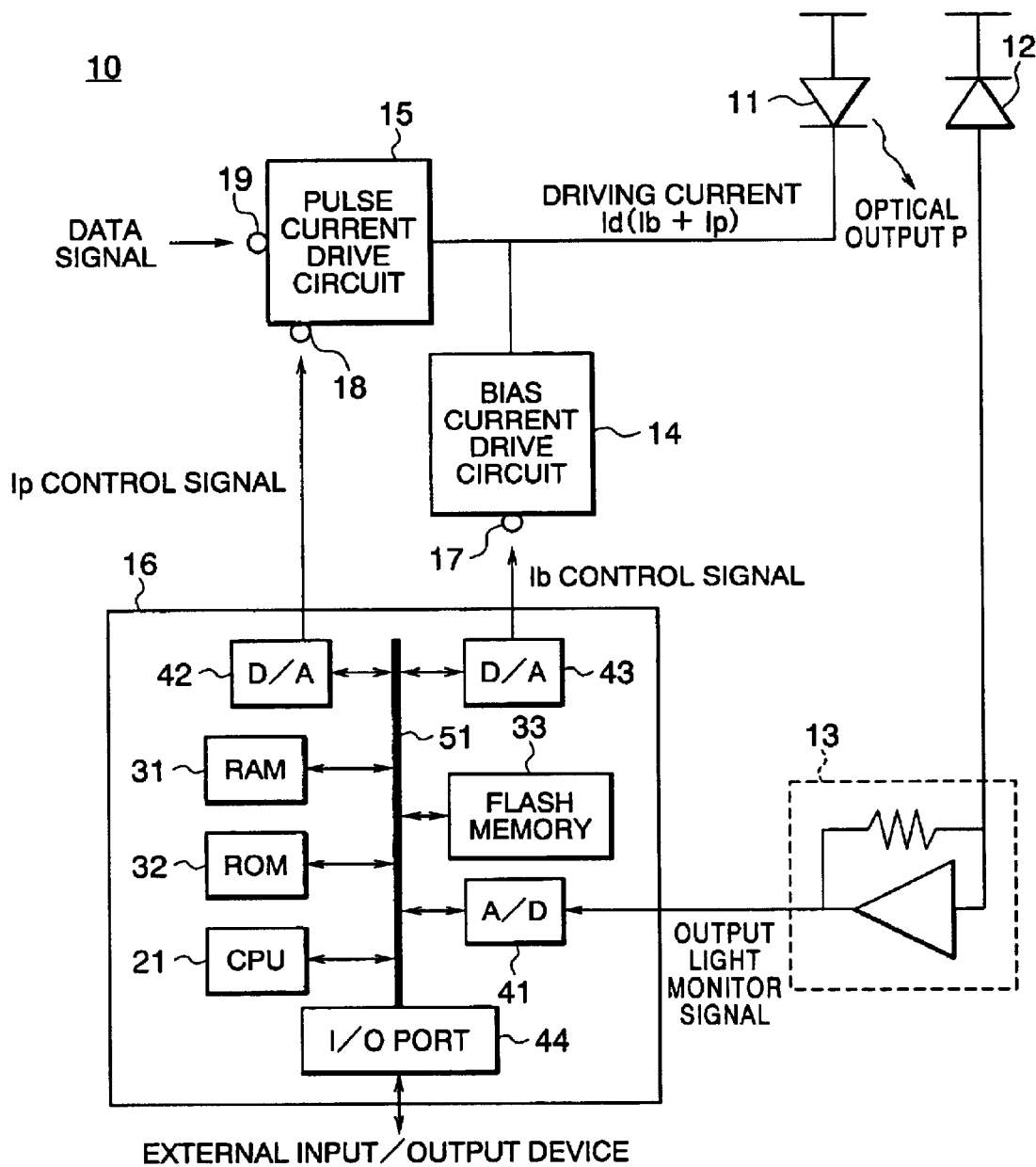
FIG. 1 is a block diagram showing the configuration of an optical transmitting apparatus according to a first embodiment of the present invention.

FIG. 1 is a block diagram showing the configuration of an optical transmitting apparatus 10 according to a first embodiment of the present invention.

The optical transmitting apparatus (optical transmitter) 10 is a transmitting apparatus which transmits modulated light modulated in correspondence with a data signal, and is constituted of a semiconductor laser 11 being a semiconductor light-emitting element, a monitor PD (Photo Diode) 12, an optical output monitor circuit 13, a bias current drive circuit 14, a pulse current drive circuit 15, and a light-emitting element controller 16.

The semiconductor laser 11 is a light-emitting element which is driven by a driving current Id made by superimposing a bias current (component) Ib and a pulse current (component) Ip one upon the other. The semiconductor laser 11 outputs light (modulated light) which quickly blinks between a plurality of light intensities Pmax and Pmin respectively corresponding to data signals 0 and 1 or the like transmitted by optical communication.

The monitor PD 12 is a light-receiving element which detects an average optical output (time average of optical output) Pa of the semiconductor laser 11.

The optical output monitor circuit 13 is a circuit which converts an output from the monitor PD 12 into a voltage signal and outputs it as an output light monitor signal (average optical output information) of the semiconductor laser 11.

The monitor PD 12 and the optical output monitor circuit 13 do not need to directly detect the modulated light itself (at a plurality of light intensities Pmax and Pmin respectively) from the semiconductor laser 11 but are only required to be able to detect the time average of the modulated light. In other words, both the monitor PD 12 and the optical output monitor circuit 13 only need to be constituted of detecting means having a low response speed to some degree and do not need to be high-speed detecting means which are often expensive.

The bias current drive circuit 14 is a circuit which outputs the bias current component Ib of the driving current for driving the semiconductor laser 11, and has a bias control information input unit 17 to which an Ib control signal (bias current control information) is inputted. Based on the bias current control information inputted through the bias control information input unit 17, the bias current component is set which is to be outputted from the bias current drive circuit 14.

The pulse current drive circuit 15 is a circuit having a pulse control information input unit 18 to which an Ip control signal (pulse current control information) is inputted, and a data signal input unit 19 to which a data signal to be transmitted by optical communication is inputted.

The pulse current drive circuit 15 outputs the pulse current component corresponding to the data signal inputted to the data signal input unit 19. Further, based on the pulse current control information inputted through the pulse control information input unit 18, the pulse current component is set which is to be outputted from the pulse current drive circuit 15.

The bias current Ib and the pulse current Ip respectively outputted from the bias current drive circuit 14 and the pulse current drive circuit 15 are superimposed one upon the other to be the driving current Id and supplied to the semiconductor laser 11.

In other words, the bias current drive circuit 14 and the pulse current drive circuit 15 are combined to constitute a drive current supply unit which supplies the driving current to the semiconductor laser 11.

The light-emitting element controller 16 is a control means which inputs thereto the average optical output information from the optical output monitor circuit 13 to generate the Ib control signal and the Ip control signal for controlling a bias current value and a pulse current value, and is constituted of a CPU (Central Processing Unit) 21, a memory (storage device) 30 (a RAM 31, a ROM 32, and a flash memory 33), an A/D converter 41, D/A converters 42 and 43, an I/O (input/output) port 44, and a bus 51.

The CPU 21, which is a processing unit, performs arithmetic and logical operations and conducts a control accompanying execution of a program.

The memory 30 stores a program and data therein, and is divided into the RAM 31, ROM 32, and flash memory 33.

The RAM 31 is a volatile memory that has both read and write functions and is used as a work area for storage of data and execution of a program.

The ROM 32 is a non-volatile memory that normally has only a read function and is used for storage of a program and fixed data.

The flash memory 33 is an electrically rewritable non-volatile memory and used for storing therein constants for control of the later-described target average optical output, target extinction ratio, and so on, and recording therein a program, so that the program is rewritten from the outside to enable adjustment and change of the control to be performed in correspondence with specifications and variations in characteristics of optical semiconductor lasers and so on.

The A/D converter 41 is a converter which analog-digital converts an output monitor signal outputted from the optical output monitor circuit 13 and inputs it thereto, and thus serves as an optical output information input unit.

The D/A converters 42 and 43 are converters respectively which analog-digital convert control information from the CPU 21 and output them as the Ib control signal (bias current control information) and the Ip control signal (pulse current control information) to the bias current drive circuit 14 and the pulse current drive circuit 15, and thus serve as control information output units.

The I/O port 44 passes data between the CPU 21 and an input/output device outside the optical transmitting apparatus 10. In other words, communication from the outside of the optical transmitting apparatus 10 and control of the semiconductor laser 11 are conducted through the I/O port 44.

The bus 51 is composed of a plurality of signal lines and passes data among the CPU 21, the memory 30, and so on in the light-emitting element controller 16.

As described above, in this embodiment, a microcomputer is used as the light-emitting element controller 16 to control the semiconductor laser 11 using software (program).

The CPU 21 is operated by the software to constitute a current-optical output coefficient deriving unit which derives a current-optical output coefficient, a pulse current determining unit which determines the pulse current component of the driving current, a bias current determining unit which determines the bias current component of the driving current, and an optical output variation detecting unit which detects a fact that the optical output of the semiconductor light-emitting element falls outside a predetermined tolerance.

(Basic Idea for Controlling Optical Transmitting Apparatus 10)

Hereafter, the basic idea of a method for controlling the optical transmitting apparatus 10 will be explained.

Figure 2:
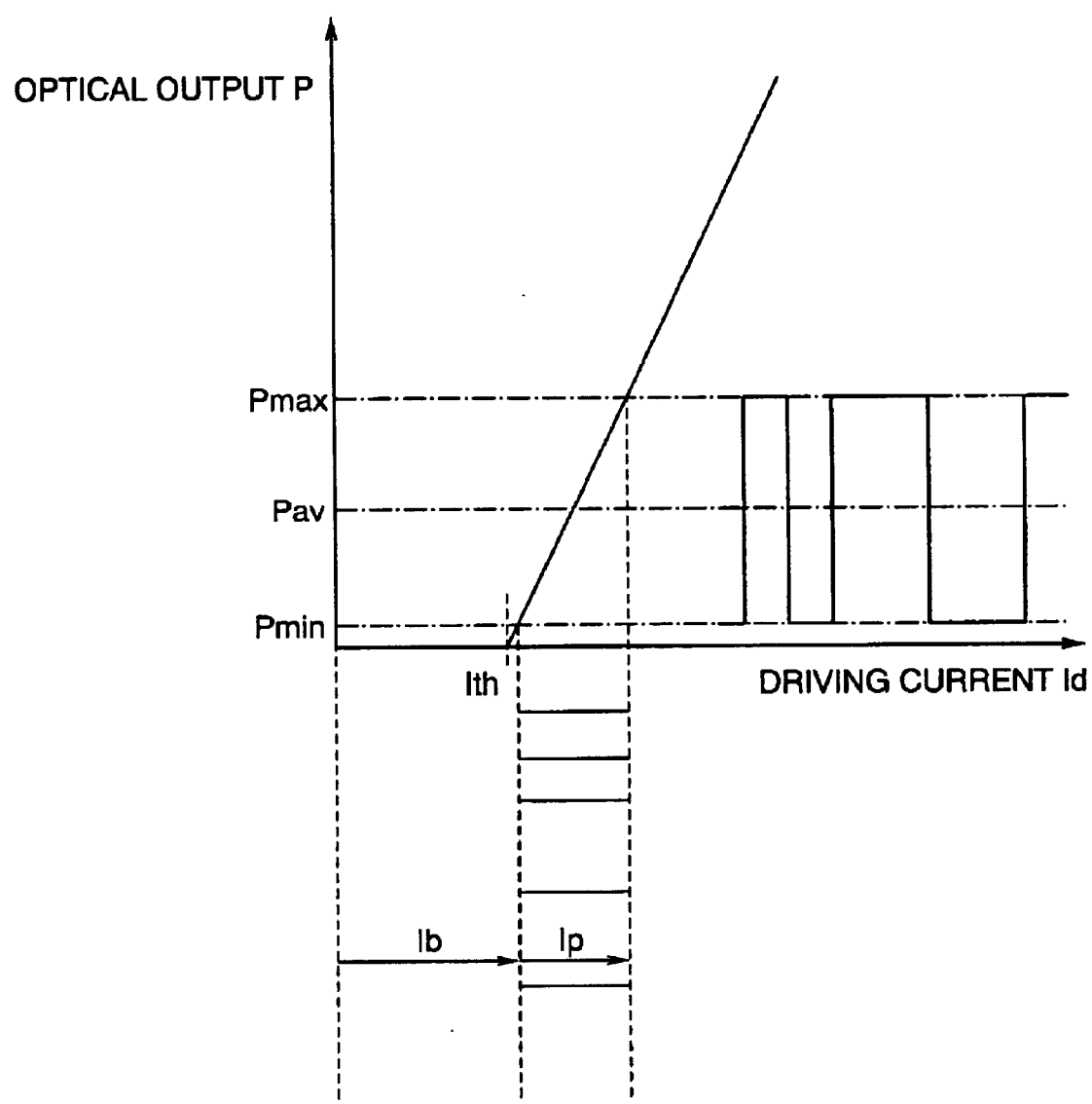
FIG. 2 is a graph showing an example of current-optical output characteristics of a semiconductor laser.

A. Relation Between the Current-Optical Output Characteristics of the Semiconductor Laser, the Bias Current Ib, and the Pulse Current Ip FIG. 2 is a graph showing an example of the current-optical output characteristics of the semiconductor laser 11.

As shown in this drawing, the semiconductor laser 11 has current-optical output characteristics that it emits light when the driving current Id exceeds an oscillation threshold current Ith (hereafter, threshold current), and an optical output P is proportional to the amount of the driving current exceeding the threshold current.

More specifically, the current-optical output characteristics of the semiconductor laser 11 can be approximately represented by the following equation (1), such that $$P=\eta(Id-Ith) \qquad (1)$$

where Ith is the threshold current of the semiconductor laser 11, and η is a current-light conversion efficiency (indicating correspondence relation between the amount of change in the driving current Id and the amount of change in the optical output P and, more specifically, being a constant of proportionality indicating the proportionality relation between the driving current Id and the optical output P).

A change in the current-optical output characteristics due to variations in temperature environment and so on of the semiconductor laser 11 can be indicated as changes in the threshold current Ith and the current-light conversion efficiency η.

The semiconductor laser 11 is driven by the driving current Id made by superimposing the bias current Ib and the pulse current Ip modulated in correspondence with an input data signal one upon the other. It should be noted that the bias current Ib is preferably set larger in value than the threshold current Ith. This is for making the time response of the semiconductor laser 11 quicker.

The optical output P from the semiconductor laser 11 moves between the maximum optical output Pmax and the minimum optical output Pmin in response to ON/OFF of the pulse current Ip. The maximum optical output Pmax and the minimum optical output Pmin in this event are represented as in the following equations (2) to (4) using the bias current Ib and the pulse current Ip.

$$Pmax=\eta(Ib+Ip-Ith) \qquad (2)$$

$$Pmin=\eta(Ib-Ith) \ (Ib \geq Ith) \qquad (3)$$

$$Pmin=0 \ (Ib<Ith) \qquad (4)$$

B. Relation Between "the Bias Current Ib and the Pulse Current Ip" and "an Average Optical Output Pav and an Extinction Ratio ER"

The optical output from such an optical transmitting apparatus 10 (semiconductor laser 11) is often defined by the average optical output Pav and the extinction ratio ER. In other words, it is preferable that even when the current-optical output characteristics of the semiconductor laser 11 change, the average optical output Pav and the extinction ratio ER are the same.

As shown below, in this embodiment, it is made possible to control the bias current Ib and the pulse current Ip supplied to the semiconductor laser 11 so as to keep the average optical output Pav and the extinction ratio ER constant irrespective of a change in the current-optical output characteristics (the threshold current Ith and the current-light conversion efficiency η).

As shown in the following equations (5) and (6), the average optical output Pav is defined by the time average of the optical output P from the semiconductor laser 11, and the extinction ratio ER is defined by the ratio between the maximum optical output Pmax and the minimum optical output Pmin, respectively, such that $$Pav=\int P \cdot dt / \int dt \qquad (5)$$

$$ER=Pmax/Pmin \qquad (6)$$

where ∫ is an integral symbol.

There are two typical methods used for the data signal, that is, the RZ (Return-to-Zero) method and the NRZ (Non-Return-to-Zero) method. In the RZ method, the optical output keeps Pmax during a period during which the data signal indicates data of 1. In the NRZ method, the optical output is at Pmax during the first half of the period during which the data signal indicates data of 1 and the optical output returns to Pmin during the second half thereof.

Further, the appearance ratio of signals 1 and 0 is often defined as a mark ratio M.

The average optical output Pav defined by the equation (5) is represented by the following equation (7) in correspondence with differences in such signal method and mark ratio M, such that $$Pav=a \cdot M \cdot Pmax+(1-a \cdot M) \cdot Pmin \qquad (7)$$

where "a" is a coefficient which determines the ratio of Pmax and Pmin appearing during the period during which the data signal is 1 (a=1/2 in the RZ method, and a=1 in the NRZ method).

By substituting the equations (2) and (3) into the equations (6) and (7), the following equations (8) and (9) can be derived which represent the average optical output Pav and the extinction ratio ER when the bias current Ib is equal to or larger than the threshold current Ith (Ib≧Ith).

$$Pav=\eta[Ib-Ith+a \cdot M \cdot Ip] \qquad (8)$$

$$ER=(Ip+Ib-Ith)/(Ib-Ith) \qquad (9)$$

Besides, the average optical output Pav when the bias current Ib is smaller than the threshold current Ith (Ib<Ith), is represented as in the following equation (10).

$$Pav=\eta[a \cdot M \cdot (Ib+Ip-Ith)] \qquad (10)$$

From the equations (8) and (9), the bias current Ib and the pulse current Ip are represented by the following equations (11) and (12).

$$Ip=Pav \ (ER-1)/[\eta \cdot (1+a \cdot M \cdot (ER-1))] \qquad (11)$$

$$Ib=Pav/[\eta \cdot (1+a \cdot M \cdot (ER-1))]+Ith \qquad (12)$$

Accordingly, if the current-light conversion efficiency η and threshold current Ith which have changed due to the environmental temperature and aging are found, it is possible to keep the average optical output Pav and the extinction ratio ER constant by driving the semiconductor laser 11 with the bias current Ib and the pulse current Ip obtained using the equations (11) and (12).

C. Basic Idea for Determining the Bias Current Ib and the Pulse Current Ip

It is preferable to be able to conduct a control of such a driving current Id in an in-service state (a state where a data signal is being transmitted by optical output). For this reason, in this embodiment, the bias current Ib and the pulse current Ip are adjusted using the current-light conversion efficiency η and the average optical output Pav. In other words, in this embodiment, the threshold current Ith is not directly detected.

(1) The reasons that the threshold current Ith is not directly detected in this embodiment are as follows:

As has been described, the average optical output Pav is represented by the different equations (8) and (10) depending on whether or not the bias current Ib is equal to or larger than the threshold current Ith. Besides, the bias current Ib can be smaller than the threshold current Ith (Ib<Ith) with an increase in the threshold current Ith due to a temperature change or the like. Therefore, calculation of the threshold current Ith requires judgment whether or not "Ib≧Ith".

Unless being in the in-service state is a precondition, the threshold current Ith can be obtained by greatly varying Ib. Further, the use of a light detector having quick response (which can recognize and detect not the average optical output Pav but each of the maximum and minimum optical outputs Pmax and Pmin), in place of the monitor PD 12, makes it possible to easily judge whether "Ib<Ith".

However, it is difficult to directly detect the threshold current Ith with the in-service state as a precondition and through detection of the average optical output Pav (in other words, using a light detector having a low response speed).

The foregoing are the reasons for no direct detection of the threshold current Ith performed in this embodiment.

(2) In contrast to the above, the current-light conversion efficiency η can be easily detected from the average optical output Pav in the in-service state.

In the equations (8) and (10), it is assumed that when the pulse current Ip is changed from Ip to Ip+ΔIp, the average optical output Pav changes from Pav to Pav +ΔPav. In this event, the current-light conversion efficiency η in either of the equations (8) and (10) is represented by the following equation (13).

$$\eta = \Delta Pav/(a \cdot M \cdot \Delta Ip) \quad (13)$$

As described above, the current-light conversion efficiency η can be calculated using the same equation (13), irrespective of whether "Ib≧Ith".

More specifically, the current-light conversion efficiency η can be obtained by giving a change of only ΔIp to the pulse current Ip and detecting a change ΔPav in the average optical output Pav at that time. In this event, the driving current ΔId is set at an amount of change so small as not to affect transmission characteristics, so that the current-light conversion efficiency η can be detected without stopping output of an optical signal (in the in-service state).

D. Outline of a Technique for Determining the Bias Current Ib and the Pulse Current Ip In this embodiment, the current-light conversion efficiency η is obtained as described below, and further the pulse current Ip is calculated using the equation (11), based on a target average optical output Pav0 and a target extinction ratio ER0. Then, with the pulse current Ip being set to the calculated pulse current Ip, the bias current Ib is adjusted so that the average optical output Pav becomes the target average optical output Pav0. Through such a control, the bias current Ib is automatically adjusted to a value determined from the equation (12).

As described above, the technique eliminates the necessity of the detection of the threshold current Ith and enables adjustment of both the bias current Ib and the pulse current Ip in the in-service state.

(Procedure for Controlling Optical Transmitting Apparatus 10)

Hereafter, a procedure for controlling the optical transmitting apparatus 10 will be explained.

A. Control Before Start of Data Signal Transmission by the Optical Transmitting Apparatus 10

First, the control procedure before start of the data signal transmission by the optical transmitting apparatus 10, such as at the time of power-on or the like, will be explained.

Figure 3:
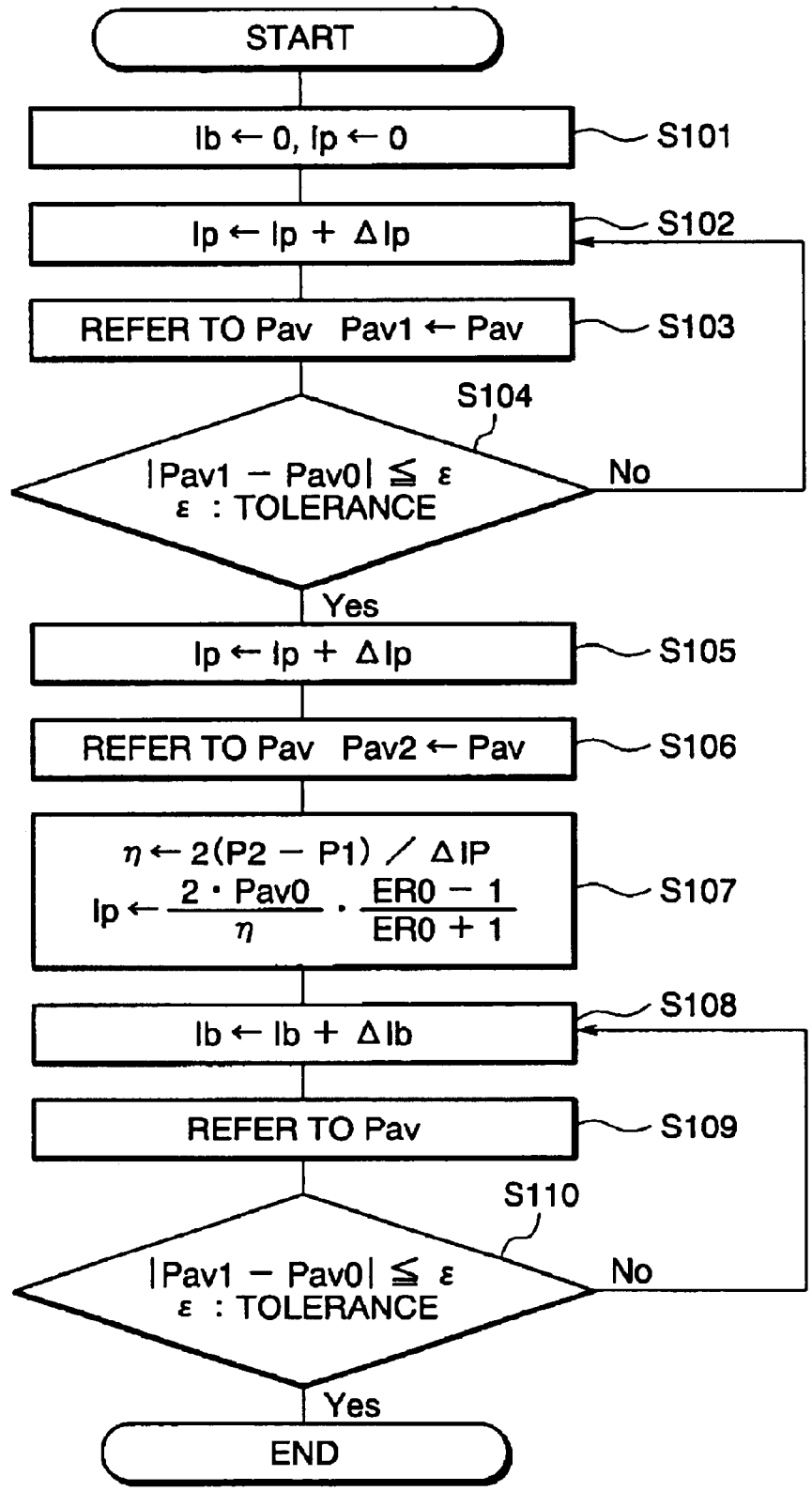
FIG. 3 is a flowchart showing an example of a control procedure before start of data signal transmission by the optical transmitting apparatus shown in FIG. 1.
Figure 4:
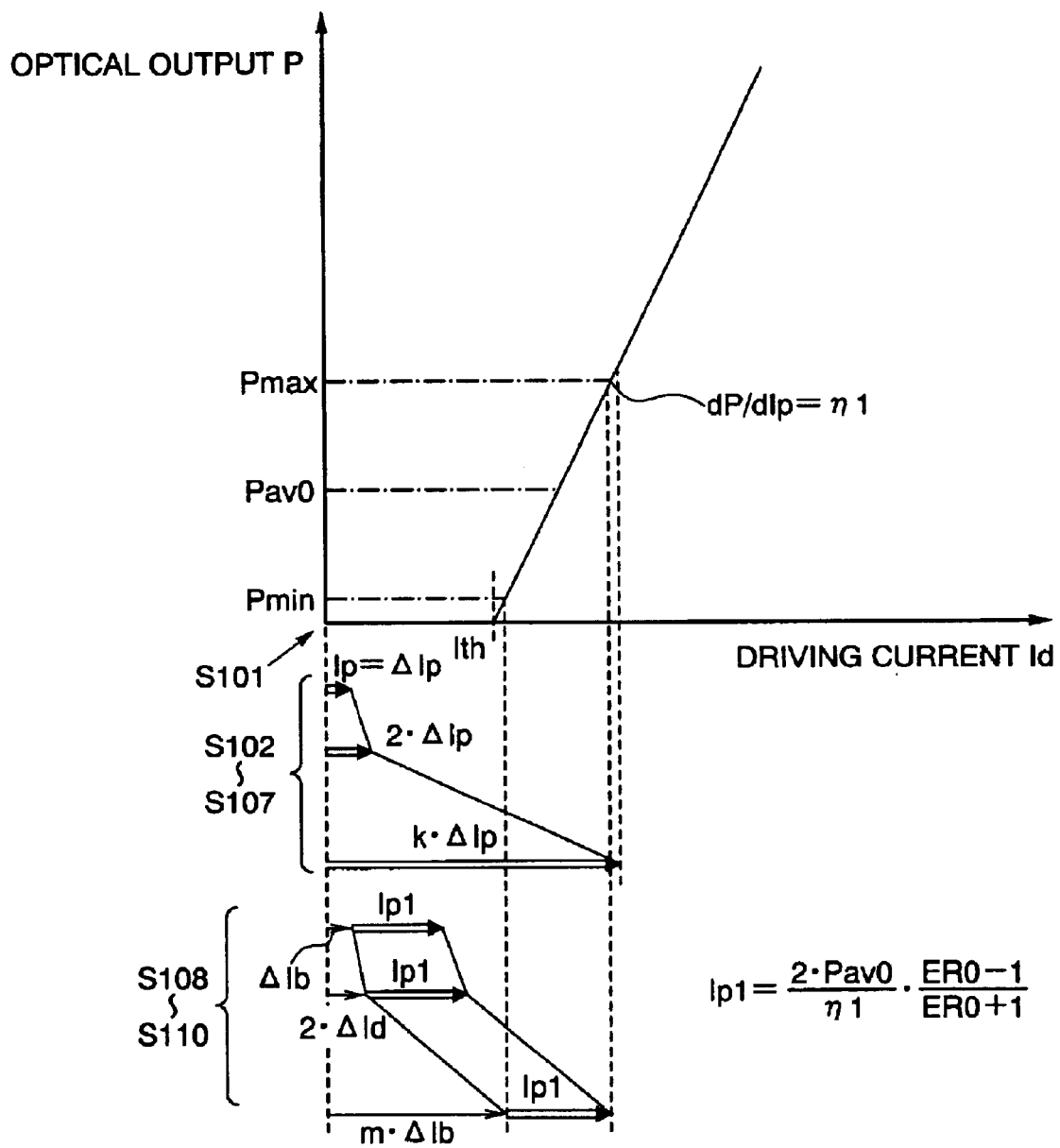
FIG. 4 is a graph showing an example of the current-optical output characteristics of the semiconductor laser controlled based on the procedure shown in FIG. 3.

FIG. 3 is a flowchart showing an example of the control procedure before start of the data signal transmission by the optical transmitting apparatus 10, and FIG. 4 is a graph showing the current-optical output characteristics of the semiconductor laser 11 in this event.

(1) Before start of the data signal transmission by the optical transmitting apparatus 10, respective initial values of the bias current Ib and the pulse current Ip of the bias current drive circuit 14 and the pulse current drive circuit 15 are set to 0 at the beginning (Step S101).

Thereafter, the pulse current Ip is gradually increased only by a predetermined step pulse current ΔIp, and the average optical output Pav which is detected by the monitor PD 12 is referred to (Steps S102 and S103).

The pulse current Ip is increased until the difference between the detected average optical output Pav and the target average optical output Pav0 becomes equal to or smaller than a tolerance ε (Step S104).

Note that the average optical output Pav is tentatively set here only for measurement to calculate the current-light conversion efficiency η, and thus there is not much need to adhere to matching the average optical output Pav to the target average optical output Pav0. The detected average optical output Pav only needs to be a value at a certain level or higher.

Note that it is assumed that the pulse current Ip when judgment in Step S104 is "Yes", is Ip01 with the average optical output at this time being Pav01.

(2) The current-light conversion efficiency η is calculated, and the pulse current Ip is calculated and set based on the calculated current-light conversion efficiency η.

The calculation and setting are performed specifically by the following procedure.

a. The pulse current Ip is set to Ip01' (=Ip01+ΔIp) (Step S105), and an average optical output Pav01' (=Pav01+ΔPav) in this event is detected (Step 106).

b. Based on the equation (13), the current-light conversion efficiency η is calculated (the first half of Step S107). Here, it is assumed that the calculated current-light conversion efficiency η is η1.

c. Based on the equation (11), the pulse current Ip is calculated (assuming that the calculated pulse current value is Ip02), and the pulse current Ip is set to Ip02 (the second half of Step S107).

Note that the equations shown in FIGS. 3 and 4 correspond to the equation (11) in the NRZ method with the mark ratio M being 1/2.

(3) The bias current Ib is set to correspond to the target average optical output Pav0.

Specifically, this setting is performed as described below.

The bias current Ib is gradually increased only by a step pulse current ΔIb (Step S108), the average optical output Pav is referred to (Step S109), and the control is ended at a point of time when the difference between the average optical output Pav and the target average optical output Pav0 becomes equal to or smaller than the tolerance ε (Step S110). It is assumed that the bias current Ib set as described above is Ib01.

As described above, the bias current Ib and the pulse current Ip are set to Ib01 and Ip02 respectively so that the average optical output Pav and the extinction ratio ER become the target values Pav0 and ER0 respectively.

B. Control During the Data Signal Transmission (In-Service State) by the Optical Transmitting Apparatus 10

Next, a control procedure when the current-optical output characteristics (the threshold current Ith and the current-light conversion efficiency η) of the semiconductor laser 11 change due to environmental temperature change and aging, after the bias current Ib and the pulse current Ip are set to Ib01 and Ip02 by the above-described control procedure, will be explained.

Figure 5:
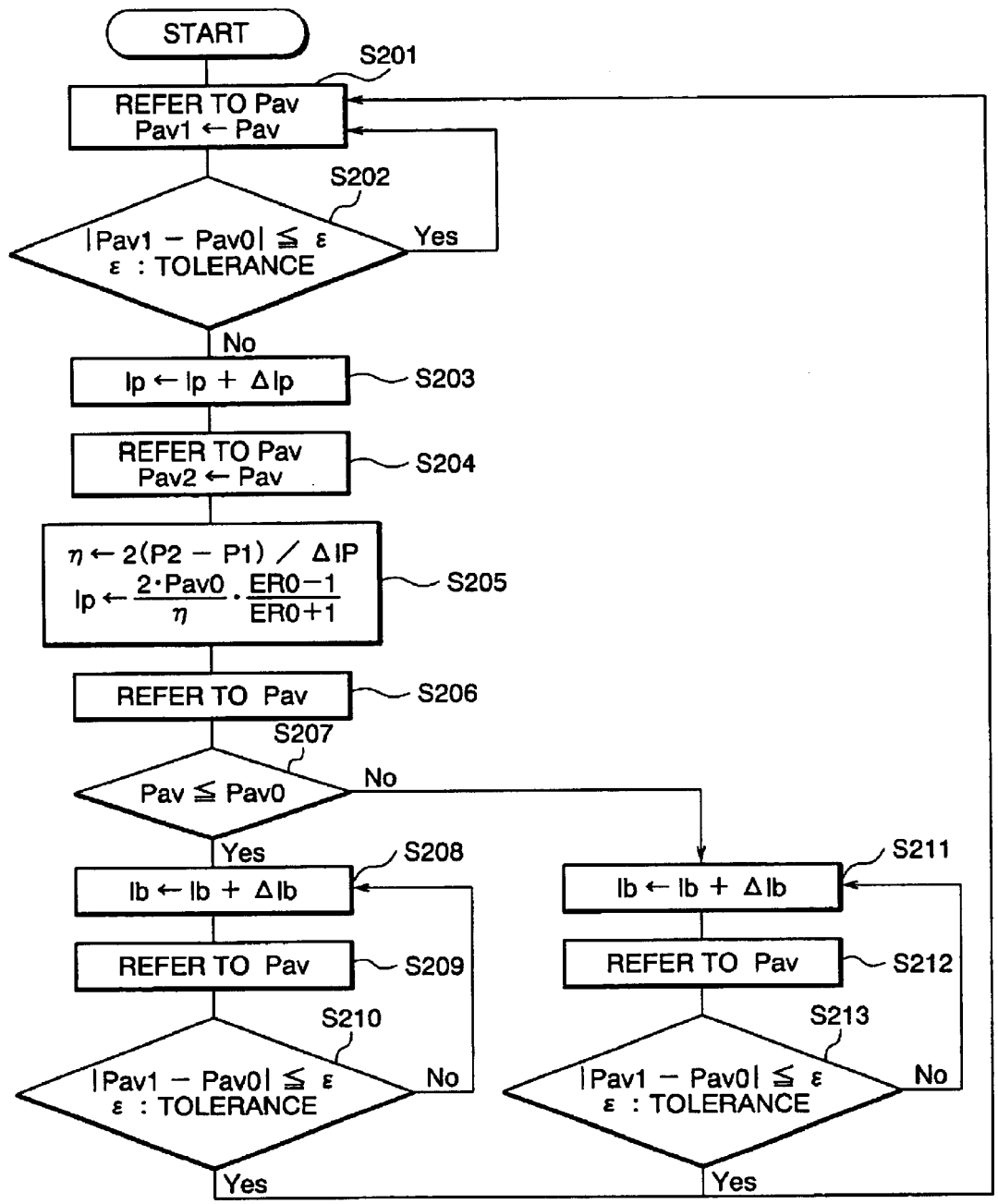
FIG. 5 is a flowchart showing an example of a control procedure during the data signal transmission by the optical transmitting apparatus shown in FIG. 1.

FIG. 5 is a flowchart showing the control procedure when the current-optical output characteristics of the semiconductor laser 11 change.

Figure 6:
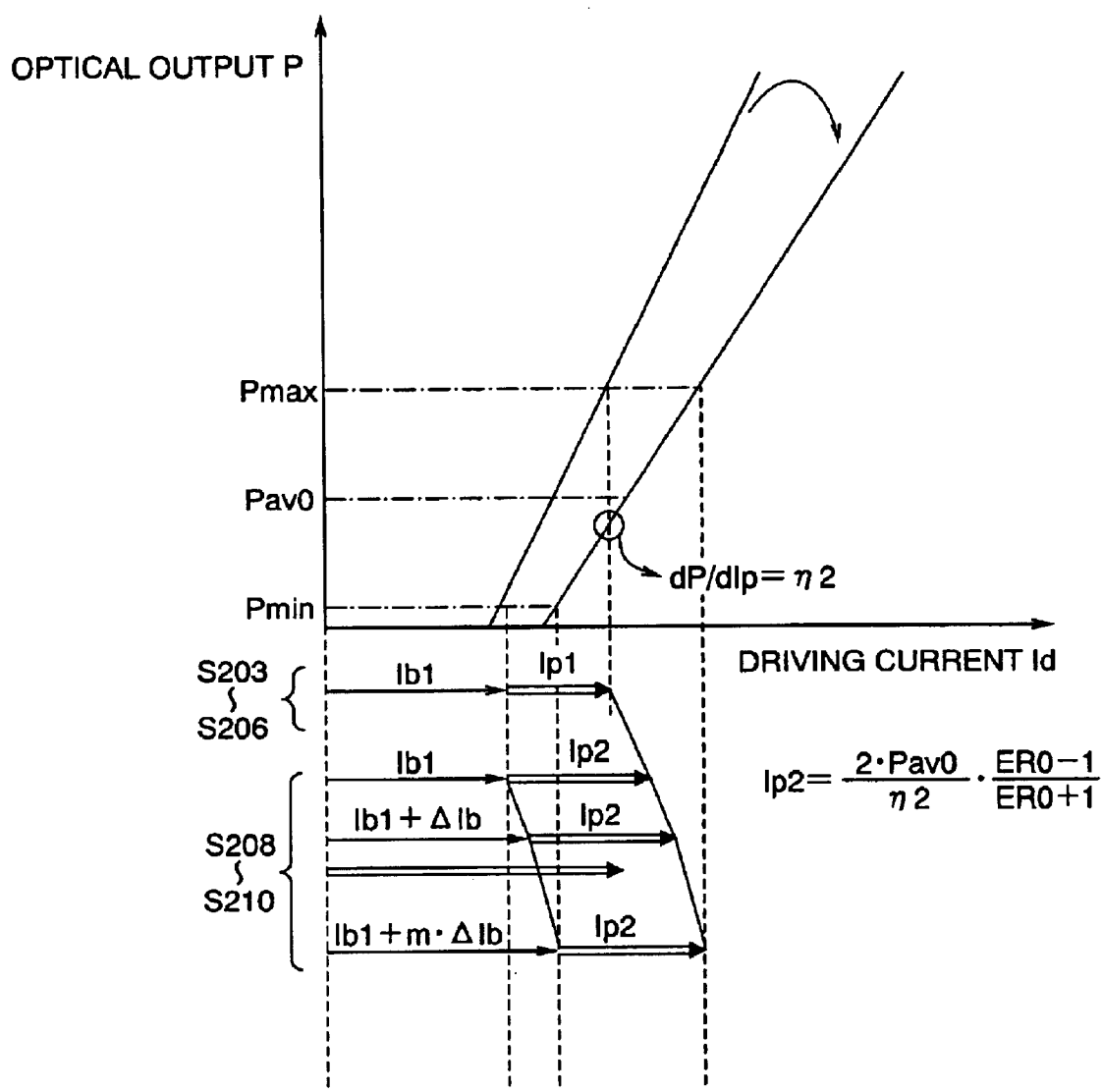
FIG. 6 is a graph showing an example of the current-optical output characteristics of the current-optical output characteristics of the semiconductor laser controlled based on the procedure shown in FIG. 5.
Figure 7:
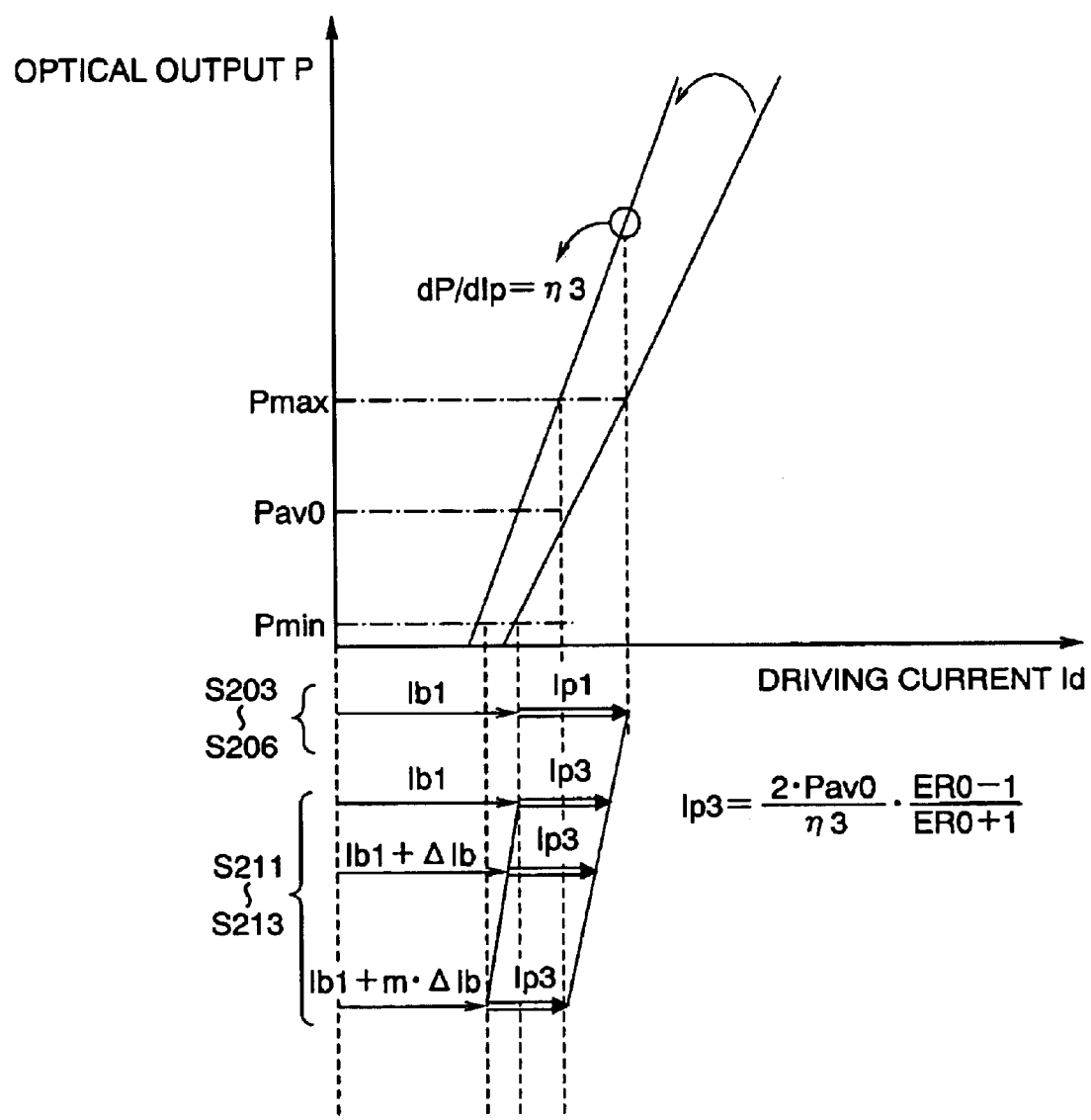
FIG. 7 is a graph showing another example of the current-optical output characteristics of the semiconductor laser controlled based on the procedure shown in FIG. 5.

Besides, FIGS. 6 and 7 are graphs respectively showing the control procedure and current-optical output characteristics of the semiconductor laser 11 when the average optical output Pav is decreased and increased. FIG. 6 shows a case where the bias current Ib becomes smaller than the threshold current Ith. FIG. 7 shows a case where the bias current Ib becomes larger than the threshold current Ith with changes in the current-optical output characteristics.

It should be noted that decreases and increases in the average optical output Pav may be caused by increases and decreases in the threshold current Ith or decreases and increases in the current-light conversion efficiency $\eta$.

(1) The light-emitting element controller 16 monitors whether the average optical output Pav matches the target average optical output Pav0.

This monitoring is conducted by referring to the average optical output Pav detected by the monitor PD 12 (Step S201), and judging whether the difference between the detected average optical output Pav and the target average optical output Pav0 falls within the tolerance $\epsilon$ (Step S202). If the judgment is Yes, it can be reasoned that there in no particular change in the current-optical output characteristics.

If the judgment in Step S202 is No, it can be reasoned that there is a change in the current-optical output characteristics (at least one of the current-light conversion efficiency $\eta$ and the threshold current Ith changes), and then resetting is started for the bias current Ib and the pulse current Ip after Step S203.

Note that it is assumed that the pulse current Ip when the judgment in Step S202 is No, is Ip1 with the average optical output at this time being Pav1.

(2) The current-light conversion efficiency is calculated, and the pulse current Ip is calculated and set based on the calculated current-light conversion efficiency $\eta$.

The calculation and setting are performed specifically by the following procedure.

a. The pulse current Ip is set to Ip1' (=Ip1+$\Delta$Ip) (Step S203), and an average optical output Pav1' (=Pav1+$\Delta$Pav) in this event is detected (Step 204).

b. Based on the equation (13), the current-light conversion efficiency $\eta$ is calculated (the first half of Step S205). Since the equation (13) is applicable with no problem caused by the magnitude relation between the bias current Ib and the threshold current Ith as has been described, the current-light conversion efficiency $\eta$ in either of cases of FIGS. 6 and 7 can be calculated using the same equation (13). It is assumed that the current-light conversion efficiencies $\eta$ which are calculated in the respective cases in FIGS. 6 and 7 are $\eta 2$ and $\eta 3$.

c. Based on the equation (11), the pulse currents Ip are calculated (assuming that the pulse current values calculated in the respective cases of FIGS. 6 and 7 are Ip2 and Ip3), and the pulse currents Ip are set to Ip2 and Ip3 respectively (the second half of Step S205).

Note that the equations shown in FIGS. 5 to 7 correspond to the equation (11) in the NRZ method with the mark ratio M being 1/2.

(3) The bias current Ib is set to correspond to the target average optical output Pav0.

Specifically, this setting is performed as described below.

a. First, the average optical outputs Pav when the pulse currents Ip are reset to Ip2 and Ip3 are respectively referred to (Step S206) to judge whether the referred average optical output Pav is equal to or lower than the target average optical output Pav0 (Step S207).

This judgment is performed to determine whether the average optical output Pav is to be increased or decreased.

b. When the judgment in Step S207 is Yes, the bias current Ib is gradually increased only by a step pulse current Ib from the initially set value (Step S208), the average optical output Pav is referred to (Step S209), and the control is ended at a point of time when the difference between the average optical output Pav and the target average optical output Pav0 becomes equal to or smaller than the tolerance $\epsilon$ (Step S210). It is assumed that the bias current Ib set in this event is Ib2.

On the other hand, when the judgment in Step S207 is No, the bias current Ib is gradually decreased only by the step pulse current $\Delta$Ib from the initially set value (Step S211), the average optical output Pav is referred to (Step S212), and the control is ended at a point of time when the difference between the average optical output Pav and the target average optical output Pav0 becomes equal to or smaller than the tolerance $\epsilon$ (Step S213). It is assumed that the bias current Ib set in this event is Ib3.

As described above, the bias currents Ib are set to Ib2 and Ib3, and the pulse currents Ip are set to Ip2 and Ip3 respectively so that the average optical output Pav and the extinction ratio ER become the target values Pav0 and ER0 respectively.

When the setting is completed in Steps S210 and S213, the procedure is returned to Step S201 so that monitoring whether the average optical output Pav matches the target average optical output Pav0, is conducted.

Repeat of the above-described control operation at all times makes it possible to compensate changes in the current-optical output characteristics of the semiconductor laser 11 due to the environmental temperature change and aging and maintain a predetermined average optical output Pav and extinction ratio ER at all times.

In addition, it becomes possible in this embodiment to compensate variations in the threshold current Ith and the current-light conversion efficiency $\eta$ of the semiconductor laser 11 and keep the average optical output Pav and the extinction ratio ER constant in the in-service state.

(Second Embodiment)

Figure 8:
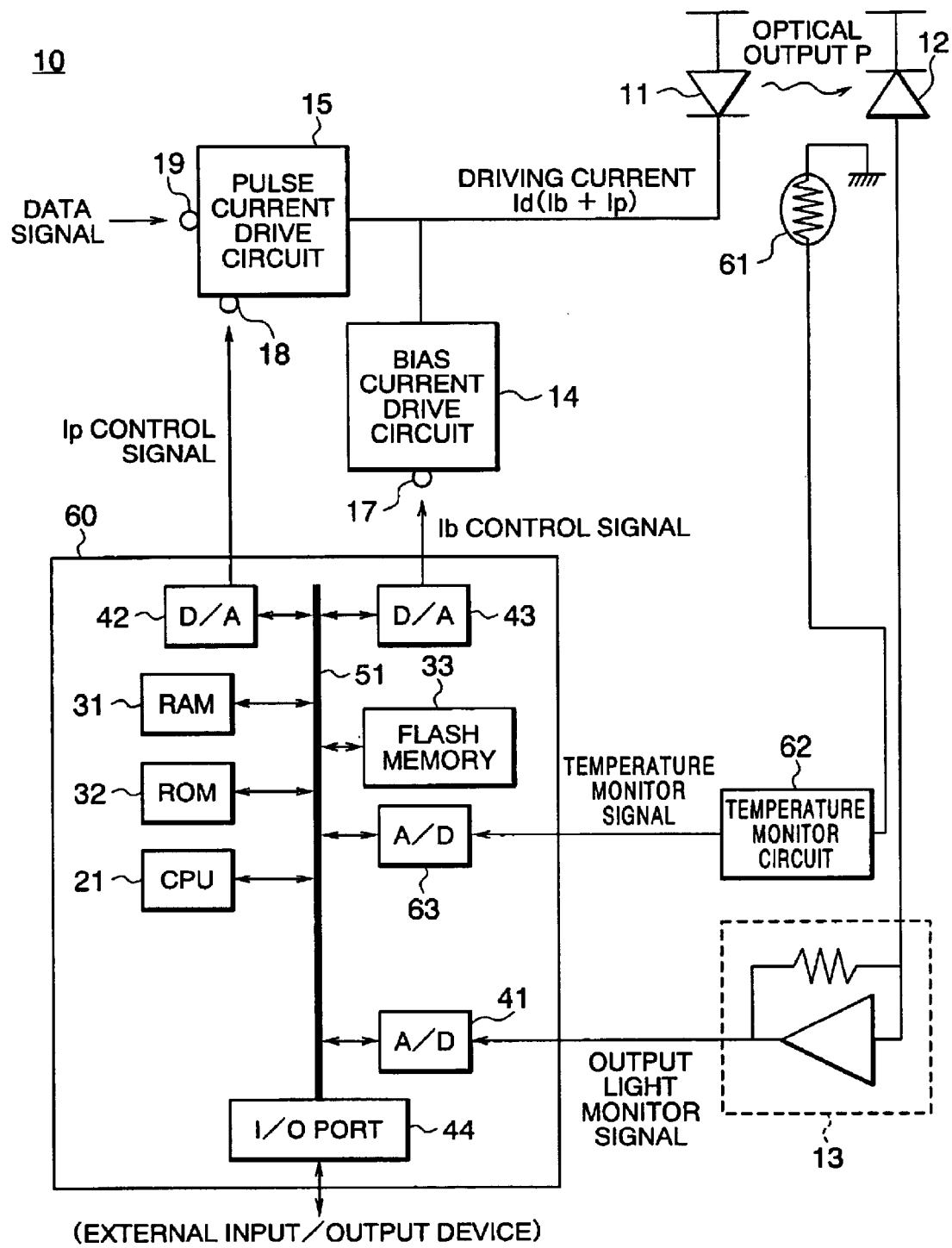
FIG. 8 is a block diagram showing the configuration of an optical transmitting apparatus according to a second embodiment of the present invention.

FIG. 8 is a block diagram showing the configuration of an optical transmitting apparatus 20 according to a second embodiment of the present invention.

The optical transmitting apparatus 20 is a transmitting apparatus which transmits modulated light modulated in correspondence with a data signal, and is constituted of a semiconductor laser 11, a monitor PD 12, an optical output monitor circuit 13, a bias current drive circuit 14, a pulse current drive circuit 15, a light-emitting element controller 60, a thermistor 61, a temperature monitor circuit 62, and an A/D converter 63. In short, the optical transmitting apparatus 20 is different from the optical transmitting apparatus 10 in respect of having the thermistor 61, the temperature monitor circuit 62, and the A/D converter 63.

The thermistor 61 is disposed close to or in contact with the semiconductor laser 11, and changes in resistance in accordance with the temperature of the semiconductor laser 11. In other words, the thermistor 61 serves as a temperature sensor for measuring the temperature of the semiconductor laser 11.

The temperature monitor circuit 62 is a converter which is electrically connected to the thermistor 61, converts the resistance value of the thermistor 61 into a voltage corresponding to the temperature of the semiconductor laser 11, and outputs it as a temperature monitor signal.

The A/D converter 63 is a converter which analog-digital converts the temperature monitor signal outputted from the temperature monitor circuit 62 and inputs it thereto, and thus serves as a temperature information input unit.

In this embodiment, a current-light conversion efficiency correction table is stored in a flash memory 33. The current-light conversion efficiency correction table is a table showing, in correspondence with a temperature T, a current-light conversion efficiency correction coefficient $\alpha(T)$ for correcting the error in the current-light conversion efficiency $\eta$ caused by nonlinearity of the current-optical output characteristics, and will be explained later in detail.

Besides, a ROM 32 stores software for correcting the current-light conversion efficiency $\eta$ using the current-light conversion efficiency correction table. This software and a CPU 21 are combined to constitute a current-optical output coefficient correcting unit which corrects the current-light conversion efficiency $\eta$ (current-optical output coefficient).

It should be noted that other components of the optical transmitting apparatus 20 are not greatly different from those of the optical transmitting apparatus 10, and thus the description thereof is omitted.

(Basic Idea for Controlling Optical Transmitting Apparatus 20)

Hereafter, the basic idea of a method for controlling the optical transmitting apparatus 20 will be explained.

In the first embodiment, it is a precondition that the current-optical output characteristics of the semiconductor laser 11 are generally linear. On the other hand, in this embodiment, a possibility is taken into account such that the current-optical output characteristics of the semiconductor laser 11 have nonlinearity. In a detailed inspection, the characteristics of the semiconductor laser 11 include nonlinearity to some extent. When the semiconductor laser 11 is operated under a high temperature or at a high optical output, the current-optical output characteristics become saturated on a high current side (near the maximum optical output Pmax), resulting in a larger nonlinearity.

Figure 9:
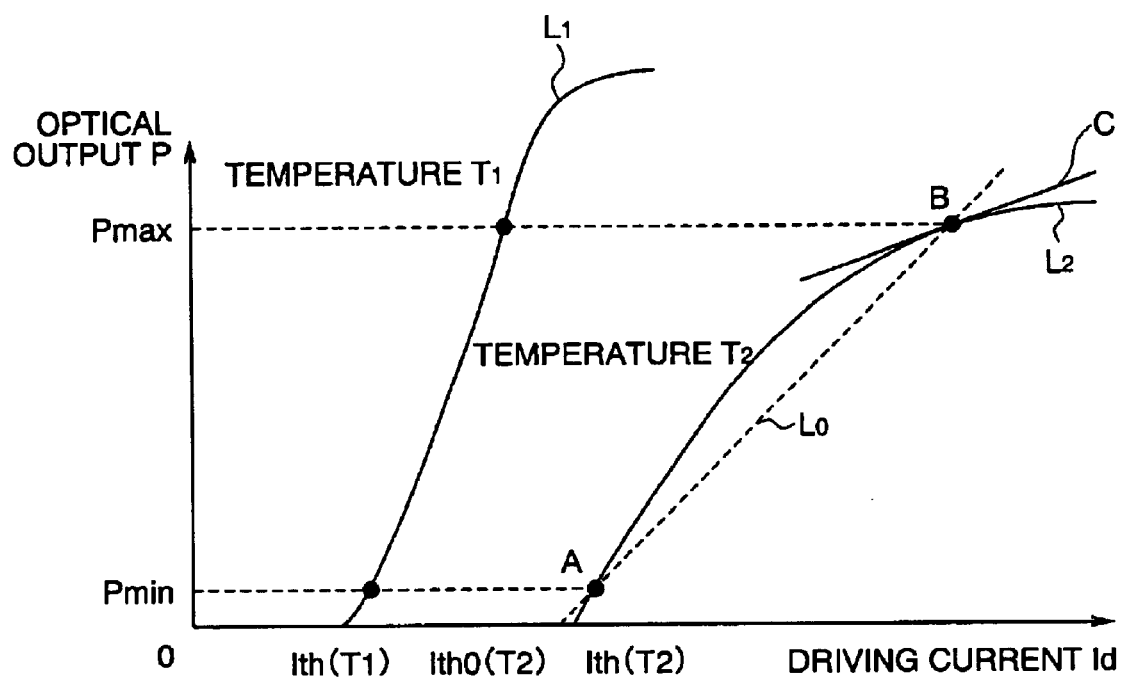
FIG. 9 is a graph showing temperature dependence of current-optical output characteristics of a semiconductor laser.

FIG. 9 is a graph showing temperature dependence of the current-optical output characteristics of the semiconductor laser 11. In this drawing, graphs L1 and L2 of the current-optical output characteristics are shown in respective cases of a temperature T1 (room temperature) and a temperature T2 (high temperature). Between the minimum optical output Pmin and the maximum optical output Pmax, while the linearity of the current-optical output characteristics is secured at the temperature T1, nonlinearity appears in the current-optical characteristics at the temperature T2. In other words, the graph L2 does not match a straight line L0 connecting points A and B at the minimum optical output Pmin and the maximum optical output Pmax.

In the example of FIG. 9, the minimum optical output Pmin and the maximum optical output Pmax at the temperature T1 are set to secure the linearity of the current-optical output characteristics. When the maximum optical output Pmax is set beyond a linear region of the current-optical output characteristics, nonlinearity of the current-optical output characteristics may turn into a problem also at the temperature T1. Hereafter, a case where nonlinearity appears in the current-optical output characteristics due to a temperature change is described as an example, and the same description also applies to a case where nonlinearity is caused by operating the semiconductor laser 11 at a high optical output.

When the nonlinearity of the current-optical output characteristics increases, it becomes not always suitable to calculate the pulse current Ip by substituting the current-light conversion efficiency $\eta$ measured based on the equation (13) into the equation (11). In other words, a difference is caused between current-optical conversion efficiencies $\eta$ in the respective equations (11) and (13). Specifically, the current-optical conversion efficiency $\eta$ derived by the equation (13) in this case is smaller than that in the case where the current-optical output characteristics are linear (the change value $\Delta$Pav in the average optical output becomes smaller).

In this case, the pulse current Ip derived using the equation (11) is larger than the original value. Accordingly, as understood from the equation (9), the extinction ratio ER of the semiconductor laser 11 increases more than necessary. This results in a possibility that the driving current Id corresponding to the minimum optical output Pmin becomes closer to the threshold current Ith of the semiconductor laser 11 or equal to or lower than the threshold current Ith in some cases.

When the semiconductor laser 11 is operated between the driving current Id equal to or lower than the threshold current Ith (in the case of the minimum optical output Pmin) and the driving current Id exceeding the threshold current Ith (in the case of the maximum optical output Pmin), a line width of emitted light (spectral line width) becomes easy to increase. The increased line width of emitted light may lead to a possibility that when a pulse of light is transmitted through an optical fiber, the pulse may be deformed (in general, the velocity of light passing through the optical fiber slightly differs depending on the wavelength of the light) to increase dispersion penalty characteristics (degradation in receiver sensitivity when the light from the semiconductor laser 11 is transmitted through the optical fiber).

When the current-light conversion efficiencies $\eta$ in the equations (11) and (13) are set to $\eta 0(T)$ and $\eta m(T)$ respectively, the following equations (21) and (22) are provided. Note that $\eta 0(T)$ and $\eta m(T)$ represent that respective current-light conversion efficiencies $\eta 0$ and $\eta m$ change depending on a temperature T (being functions of the temperature T).

$$\eta m(T) = \Delta Pav/(a \cdot M \cdot \Delta Ip) \tag{21}$$

$$Ip = Pav(ER-1)/[\eta 0(T) \cdot (1 + a \cdot M \cdot (ER-1))] \tag{22}$$

A. Current-Light Conversion Efficiency $\eta m(T)$

The equation (21) corresponds to the equation (13), so that the current-light conversion efficiency $\eta$ is measured based on the equation (21). In other words, it can be said that the equation (21) is an equation for defining the current-light conversion efficiency $\eta m(T)$ being a measurement value.

When the semiconductor laser 11 is in the in-service state, the semiconductor laser 11 outputs respective pulses at the maximum optical output Pmax (driving current Id=Ib+Ip) and the minimum optical output Pmin (driving current Id=Ib). When the pulse current Ip is changed by a minimal amount $\Delta$Ip in this state, the equation (21) is expressed by the following equation (23) (in this event, the bias current Ib is constant, and thus the minimum optical output Pmin does not change), such that $$\eta m(T) = \Delta P\max/(a \cdot M \cdot \Delta Ip) \tag{23}$$

$$= (1/(a \cdot M)) \cdot (\Delta P\max/\Delta Ip)$$

$$\sim (1/(a \cdot M)) \cdot (dP\max/dIp)$$

where dPmax/dIp is a differential coefficient of a curved line of the current-optical output characteristics (graph L2) at the point of the maximum optical output Pmax (a gradient of a tangent line C of the graph L2 at the point B in FIG. 9).

More specifically, the current-light conversion efficiency ηm(T) measured based on the equation (21) is an amount corresponding to the gradient of the tangent line C of the graph L2 in FIG. 9 and is the gradient of the tangent line C itself if "a * M=1".

B. Current-Light Conversion Efficiency η0(T)

On the other hand, the equation (22) is an equation derived on a precondition that the current-optical output characteristics include linearity as in the equation (1). In the process of deriving the equation (11) from the equation (1), however, it is a precondition that the control is a digital control taking only two values at the maximum optical output Pmax and the minimum optical output Pmin. More specifically, it is not necessarily to show the current-optical output characteristics themselves linear as in the equation (1) but it is sufficient to represent only the values at the maximum optical output Pmax and the minimum optical output Pmin by an equation corresponding to the equation (1).

The foregoing shows that it is suitable to define the current-light conversion efficiency η0(T) in the equation (22) as in the following equation (24), such that $$\eta 0(T)=(Pmax-Pmin)/Ip \quad (24)$$

The current-optical output characteristics of the semiconductor laser 11 are represented using the following equation (25) instead of the equation (1).

$$P=\eta 0(T) \cdot (Id-Ith0(T)) \quad (25)$$

The equation (25) is shown as a straight line L0 connecting the points A and B at the maximum optical output Pmax and the minimum optical output Pmin of the graph L2 in FIG. 9. The Ith0(T) represents the driving current value at a point where this graph intersects the horizontal axis, and a difference between the Ith0(T) and the threshold current Ith(T) of the semiconductor laser 11 itself at the temperature T is tolerated. As understood from FIG. 9, it cannot be said that the equation (25) (the straight line L0) always accurately represents the optical output P other than the points A and B (the points at the minimum optical output Pmin and the maximum optical output Pmax). However, taking it into consideration that the value of the optical output P takes only the maximum optical output Pmax and the minimum optical output Pmin, it may be said that the equation (25) accurately represents the relation between the driving current Id and the optical output P. As understood from the above, all of the equations (1) to (12) hold even if η is substituted with η0(T), and Ith is substituted with Ith0(T).

C. Current-Light Conversion Efficiency Correction Coefficient Δ(T)

The relation between ηm(T) and η0(T) can be expressed by defining the current-light conversion efficiency correction coefficient α(T) as in the following equation (26).

$$\alpha(T)=\eta 0(T)/\eta m(T) \quad (26)$$

The equation (22) is expressed using this equation (26), leading to the following equation (27).

$$Ip=Pav \cdot (ER-1)/[\alpha(T) \cdot \eta m \cdot (1+a \cdot M \cdot (ER-1))] \quad (27)$$

In other words, the current-light conversion efficiency correction coefficient α(T) is obtained in advance, thereby making it possible to appropriately derive the pulse current Ib and so on by substituting the current-light conversion efficiency η0(T) measured based on the equation (21) into the equation (27).

(Derivation of Current-Light Conversion Efficiency Correction Coefficient α(T))

The current-light conversion efficiency correction coefficient α(T) can be experimentally derived in a manner as described below.

FIG. 10 is a flowchart showing a procedure for deriving the current-light conversion efficiency correction coefficient α((T). Hereinafter, a process for deriving the current-light conversion efficiency correction coefficient α(T) is explained with reference to FIG. 10.

(1) Temperature setting of the semiconductor laser 11 (Step S501)

The semiconductor laser 11 is set to a predetermined temperature T. This setting can be performed by disposing the semiconductor laser 11, for example, in a constant temperature bath and appropriately controlling the constant temperature bath.

(2) Measurement of the current-optical output characteristics of the semiconductor laser 11 (Step S502)

The driving current Id of the semiconductor laser 11 is changed at the temperature T set in Step S501, and the optical output P is measured in this event. This result can be shown, for example, in such a graph in FIG. 9.

(3) Derivation of the Current-Light Conversion Efficiency η0(T) (Step S503)

From the current-optical output characteristics measured in Step S502, driving currents Id1 and Id2 respectively at the maximum optical output Pmax and the minimum optical output Pmin are obtained. For the maximum optical output Pmax and the minimum optical value Pmin, standard values are often set, and thus those values can be used here.

The current-light conversion efficiency η0(T) can be calculated based on the equation (24) using the minimum optical output Pmin, the maximum optical output Pmax, and the driving currents Id1 and Id2. Here, "Ip=Id2−Id1".

(4) Derivation of the Current-Light Conversion Efficiency ηm(T) (Step S504)

As has been described, the current-light conversion efficiency ηm(T) is represented by the equation (23). Accordingly, the current-light conversion efficiency ηm(T) can be mathematically derived based on the current-optical output characteristics measured in step S502 (the gradient of the tangent line at the point B of the graph L2 in FIG. 9 is obtained).

Further, it is also possible to derive the current-light conversion efficiency ηm(T) based on the equation (21). In other words, with the semiconductor laser 11 being digitally operated between the minimum optical output Pmin and the maximum optical output Pmax, a minimal amount of change dPav in the average optical output Pav when the pulse current Ip is changed by a minimal amount ΔIp, is measured.

(5) Derivation of the Current-Light Conversion Efficiency Correction Coefficient α(T) (Step S505)

The current-light conversion efficiency correction coefficient α(T) can be derived by dividing η0(T) by the current-light conversion efficiency ηm(T) based on the equation (26).

(6) Change of the Temperature Setting of the Semiconductor Laser 11 (Steps S506 and S501)

Hereafter, Steps S502 to S505 are repeated with the temperature setting of the semiconductor laser 11 being changed until the current-light conversion efficiency correction coefficients α(T) at all set temperatures, are derived.

(Specific Example of Current-Light Conversion Efficiency Correction Table)

FIG. 11 is a diagram showing an example of a current-light conversion efficiency correction table including the current-light conversion efficiency correction coefficients $\alpha(T)$.

In the current-light conversion efficiency correction table shown in the drawing, the current-light conversion efficiency correction coefficients $\alpha(T)$ are shown in correspondence with temperatures T. In this example, the current-light conversion efficiency correction coefficients $\alpha(T)$ are 1.0 from a low temperature ($-40°$ C.) to room temperature ($25°$ C). In other words, the current-light conversion efficiencies $\eta m$ and $\eta 0$ are almost the same, so that the nonlinearity of the current-optical output characteristics can be almost neglected between the minimum optical output Pmin and the maximum optical output Pmax. In contrast to the above, the current-light conversion efficiency correction coefficients $\alpha(T)$ are larger than 1 at high temperatures ($75°$ C. to $85°$ C.) at which nonlinearity occurs in the current-optical output characteristics between the maximum optical output Pmax and the minimum optical output Pmin.

(Procedure for Controlling Optical Transmitting Apparatus 20)

A control during data signal transmission (in-service state) by the optical transmitting apparatus 20 will be explained.

Figure 12:
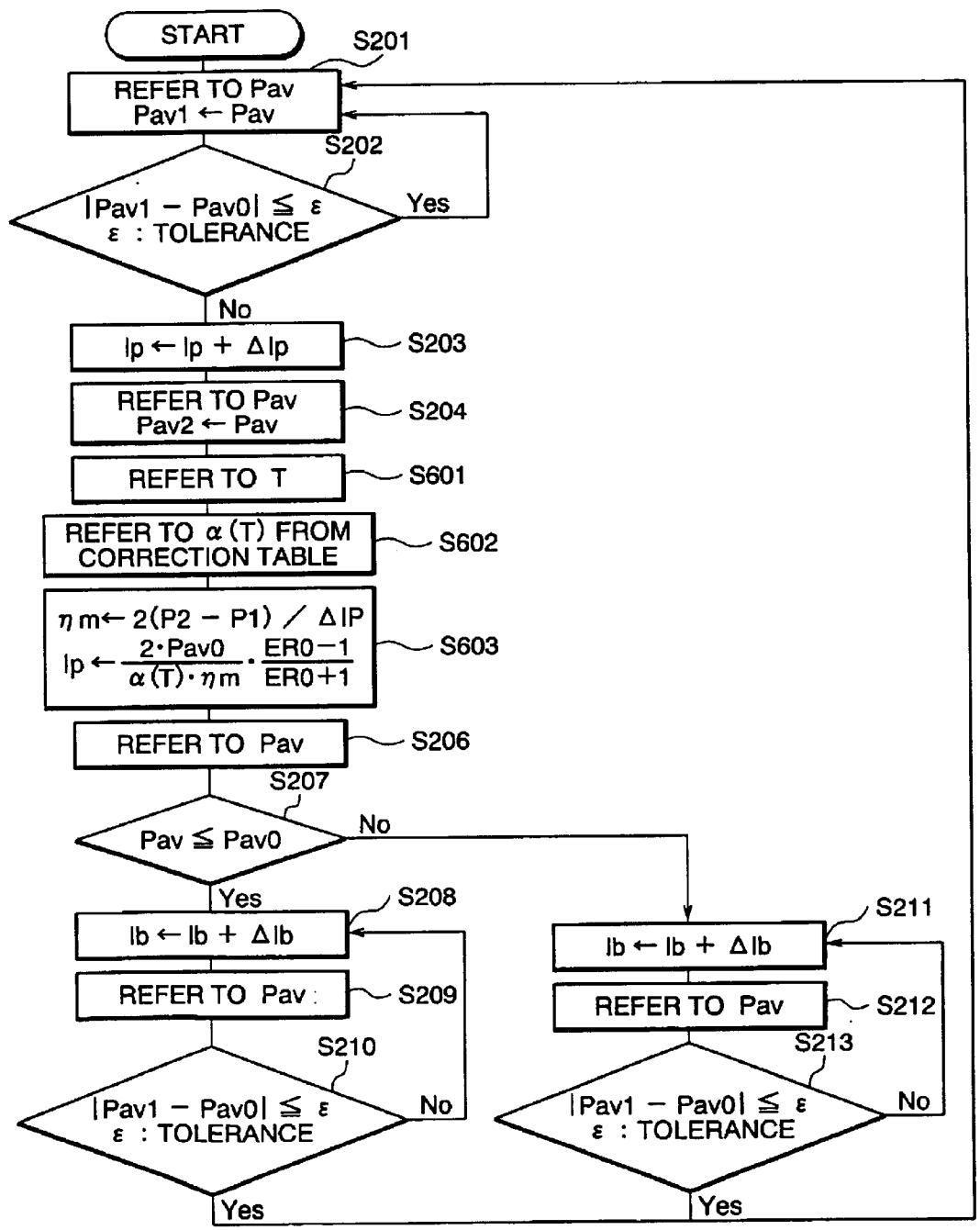
FIG. 12 is a flowchart showing an example of a control procedure during data signal transmission by the optical transmitting apparatus shown in FIG. 8.

FIG. 12 is a flowchart showing a control procedure when the current-optical output characteristics of the semiconductor laser 11 including the nonlinearity change. In this flowchart, Steps S601 to S603 are inserted in place of Step S205 in FIG. 5.

(1) The light-emitting element controller 60 monitors whether the average optical output Pav matches the target average optical output Pav0 (Steps S201 and S202).

This monitoring process is the same as that of the first embodiment, and thus the description is omitted.

(2) The current-light conversion efficiency $\eta m(T)$ is calculated and corrected, and the pulse current Ip is calculated and set.

a. The pulse current Ip is set to Ip2 (=Ip1+$\Delta$Ip) (Step S203), and an average optical output Pav2 (=Pav1+$\Delta$Pav) in this event is detected (Step 205).

b. The temperature T of the semiconductor laser 11 is measured (Step S601), and the current-light conversion efficiency correction coefficient $\Delta(T)$ corresponding to the measured temperature T is derived (Step S602).

The light-emitting element controller 60 fetches, through the temperature monitor circuit 62, information about the temperature T measured by the thermistor 61, and further derives the current-light conversion efficiency correction coefficient $\alpha(T)$ corresponding to the temperature T based on the current-light conversion efficiency correction table.

Note that, interpolation (insertion) of the current-light conversion efficiency correction coefficients $\alpha(T)$ on the current-light conversion efficiency correction table makes it possible to derive more accurately the current-light conversion efficiency correction coefficients $\alpha(T)$. This is because the current-light conversion efficiency correction coefficients $\alpha(T)$ on the current-light conversion efficiency correction table are discontinuous amounts (discrete amounts) limited to specific temperatures.

c. The current-light conversion efficiency $\eta m$ is calculated based on the equation (21) (the first half of Step S603), and the pulse current Ip is calculated based on the equation (27) (the second half of Step S603).

The equations shown in FIG. 12 correspond to the equation (27) in the NRZ method with the mark ratio M being 1/2. In this event, by multiplying the current-light conversion efficiency $\eta m$ by the current-light conversion efficiency correction coefficient $\alpha(T)$ for correction, an accurate pulse current Ip can be calculated.

As has been described, the current-light conversion efficiency correction coefficients $\alpha(T)$ are used on a precondition that the current-light conversion efficiencies $\eta m$ correspond to the gradient of the current-optical output (the gradient of the straight line C in FIG. 9) at the point of the maximum optical output Pmax (refer to the equations (23) and (27)). The average optical output Pav during the in-service state is monitored at all times in Steps S201 and S202 and thus never greatly deviates from the reference value Pav1, so that the semiconductor laser 11 is digitally operated near the target values of the minimum optical output Pmin and the maximum optical output Pmax. This makes it possible to appropriately correct the current-light conversion efficiencies $\eta m$ using the current-light conversion efficiency correction coefficients $\alpha(T)$ based on the equations (23) and (27).

Subsequent Steps S206 to S213 are the same processes as those explained in the first embodiment, and thus the description thereof is omitted.

In the above-described manner, the bias current Ib and the pulse current Ip are set so that the average optical output Pav and the extinction ratio ER become the target values Pav0 and ER0 respectively. Note that this also means that the minimum optical output Pmin and the maximum optical output Pmax are set at the target values.

When the setting is completed in Steps S210 and S213, the procedure returns to Step 201, and monitoring is performed whether the average optical output Pav matches the target average optical output Pav0.

By repeating the above-described control operation at all times, it is possible to compensate changes in the current-optical output characteristics of the semiconductor laser 11 due to environmental temperature change and aging and to keep the predetermined average optical output Pav and extinction ratio ER at all times. Further, it is also made possible to prevent the pulse current Ip from being excessive during operation at a high temperature or during operation at a high output.

As in the foregoing, it becomes possible to compensate variations in the threshold current Ith and the current-light conversion efficiency $\eta$ of the semiconductor laser 11 and further the nonlinearity occurring in the current-optical output characteristics so as to keep the average optical output Pav and the extinction ratio ER constant.

As in the first embodiment, the current-light conversion efficiency $\eta$ can be corrected before start of the service also in this embodiment. The flowchart for enabling the above correction is shown by inserting the processes of Steps S601 to S603 in FIG. 12 in place of Step S107 in FIG. 3. This flowchart is not greatly different from that in FIG. 12 in the point of correction of the current-light conversion efficiency $\eta$, and thus the detailed description thereof is omitted.

(Other Embodiments)

The embodiment of the present invention is not limited to the above-described embodiment, but can be extended and modified. Extended and modified embodiments are also included in the technical scope of the present invention.

(1) For example, the semiconductor laser is used in the above-described embodiment, and the present invention is applicable not only to the semiconductor laser but also to semiconductor light-emitting elements in general.

Further, in place of the current-optical output characteristics, voltage-optical output characteristics can also be used. In other words, the voltage-optical output characteristics correspond to the current-optical output characteristics, and it can be safely said that the voltage-optical output characteristics are substantially the current-optical output characteristics themselves.

(2) Although the semiconductor laser is controlled so that the average optical output and the extinction ratio are kept constant in the above-described embodiment, it is not necessarily to relate to the average optical output and the extinction ratio themselves, but the semiconductor laser can also be controlled based on other parameters (for example, the maximum optical output and the minimum optical output).

(3) Although the bias current and the pulse current are determined using a linear approximate equation of the current-optical output characteristics of the semiconductor laser in the above-described embodiment, there is no problem even if the current-optical output characteristics are approximated at a higher order.

Only if the current-light conversion efficiency can be derived without receiving great influence by the magnitude relation of the bias current and the threshold current, what is used for the approximating equation of the current-optical output characteristics is insignificant.

In the above sense, it is also possible to determine the pulse current and so on using current-optical output relations in general which broadly represent correspondence relation between respective changes in current and optical output, in place of the current-light conversion efficiency defined by the gradient of the optical output to the current.

What is claimed is:

1. A light-emitting element controller which controls a semiconductor light-emitting element driven by a driving current including a bias current component and a pulse current component, comprising:

a current-optical output coefficient deriving unit which derives a current-optical output coefficient η representing a correspondence relation between the amount of change in current supplied to said semiconductor light-emitting element and the amount of change in optical output, based on average optical output information representing a time average of the optical output of said semiconductor light-emitting element driven by a driving current Id including a bias current component Ib and a pulse current component Ip;

a pulse current determining unit which determines the pulse current component Ip of said driving current, based on the derived current-optical output coefficient η, a predetermined target average optical output value PavO, and a predetermined target extinction ratio ER0; and a bias current determining unit which determines the bias current component Ib of said driving current, based on the average optical output information of said semiconductor light-emitting element driven by said driving current Id including the determined pulse current component Ib so that the average optical output represented by said average optical output information matches said predetermined target average optical output, within a predetermined range.

2. The light-emitting element controller according to claim 1, further comprising:

an optical output variation detecting unit which detects that the optical output of said semiconductor light-emitting element falls outside, a predetermined tolerance.

3. The light-emitting element controller according to claim 1, wherein said current-optical output coefficient deriving unit has a current-optical output coefficient calculating unit which calculates said current-optical output coefficient η, based on a first and a second driving current including a first and a second pulse current component respectively and a first and a second average optical output of said semiconductor light-emitting element driven by the first and the second driving current respectively.

4. The light-emitting element controller according to claim 1, further comprising:

a temperature information input unit which inputs thereto temperature information of said semiconductor light-emitting element; and a current-optical output coefficient correcting unit which corrects the derived current-optical output coefficient η, based on the inputted temperature information.

5. An optical transmitting apparatus, comprising:

a semiconductor light-emitting element;

a driving current supply unit which supplies said semiconductor light-emitting element with a driving current including a bias current component Ib and a pulse current component Ip;
and
    the light-emitting element controller according to claim 1.

6. A driving current determining method for determining a driving current of a semiconductor light-emitting element comprising:

deriving a current-optical output coefficient η representing a correspondence relation between the current for driving said semiconductor light-emitting element and an optical output based on average optical output information representing a time average of the optical output of said semiconductor light-emitting element driven by a driving current Id including a bias current component Ib and a pulse current component Ip;

determining the pulse current component Ip, based on the derived current-optical output coefficient η, a predetermined target average optical output value Pav0, and a predetermined target extinction ration ER0;

controlling the driving current Id based on the determined pulse current Ip; and determining the bias current component Ib, based on the optical output of said semiconductor light-emitting element driven by the controlled driving current Id including the determined pulse current component Ib so that the average optical output represented by said average optical output information matches said predetermined target average optical output, within a predetermined range.

7. The driving current determining method according to claim 6, wherein said current-optical output coefficient deriving step has calculating said current-optical output coefficient η, based on a first and a second driving current including a first and a second pulse current component respectively and a first and a second average optical output of said semiconductor light-emitting element driven by the first and the second driving current respectively.

8. The driving current determining method according to claim 6, further comprising:

prior to said current-optical output coefficient deriving step, detecting that the optical output of said semiconductor light-emitting element falls outside a predetermined tolerance.

9. The driving current determining method according to claim 6, further comprising:

prior to said pulse current determining step, correcting the derived current-optical output coefficient, based on the temperature of said semiconductor light-emitting element.

10. A computer program executed in a computer for performing the driving current determining method for determining a driving current of a semiconductor light-emitting element comprising:

deriving a current-optical output coefficient $\eta$ representing a correspondence relation between the current for driving said semiconductor light-emitting element and an optical output based on average optical output information representing a time average of the optical output of said semiconductor light-emitting element driven by a driving current Id including a bias current component Ib and a pulse current component Ip;

determining the pulse current component Ip, based on the derived current-optical output coefficient $\eta$, a predetermined target average optical output value PavO, and a predetermined target extinction ratio ER0;

controlling the driving current Id, based on the determined pulse current Ip; and determining the bias current component, based on the optical output of said semiconductor light-emitting element driven by the controlled driving current Id including the determined pulse current component Ib so that the average optical output represented by said average optical output information matches said predetermined target average optical output, within a predetermined range.

* * * * *